United States Patent [19]

Takagi et al.

[11] 4,412,388
[45] Nov. 1, 1983

[54] METHOD FOR DRYING SEMICONDUCTOR SUBSTRATES

[75] Inventors: Mikio Takagi, Kawasaki; Hajime Kamioka, Yokohama, both of Japan

[73] Assignee: Fujitsu Limited, Kawasaki, Japan

[21] Appl. No.: 218,802

[22] Filed: Dec. 22, 1980

[30] Foreign Application Priority Data

Dec. 25, 1979 [JP] Japan ................. 54-169041

[51] Int. Cl.³ ............................................. F26B 3/34
[52] U.S. Cl. ........................................ 34/1; 118/620; 34/239; 219/10.55 R
[58] Field of Search ............... 34/1, 236, 237, 238, 34/239; 204/192 E; 219/10.55 R, 10.55 E; 118/620; 427/35, 45.1

[56] References Cited

U.S. PATENT DOCUMENTS

| 4,201,579 | 5/1980 | Robinson et al. | 204/192 E |
| 4,243,744 | 1/1981 | Lockwood et al. | 34/4 |
| 4,276,462 | 6/1981 | Risman | 219/10.55 R |
| 4,281,031 | 7/1981 | Hillman et al. | 219/10.55 R |
| 4,286,136 | 8/1981 | Mason, Jr. | 219/10.55 E |

FOREIGN PATENT DOCUMENTS 50-69972 of 1975 Japan .

Primary Examiner—Larry I. Schwartz
Attorney, Agent, or Firm—Staas & Halsey

[57] ABSTRACT

A method for drying semiconductor substrates wherein a plurality of semiconductor substrates are irradiated with electromagnetic waves emitted from a waveguide in a non-reactive atmosphere of normal atmospheric pressure while the semiconductor substrates are positioned so that the predominant faces thereof substantially form right angles to the face of an opening of the waveguide.

11 Claims, 6 Drawing Figures

METHOD FOR DRYING SEMICONDUCTOR SUBSTRATES

BACKGROUND OF THE INVENTION

1. Field of the Invention

The present invention relates to a method for drying semiconductor substrates.

2. Description of the Prior Art

In the wafer process for preparing semiconductor devices, semiconductor substrates are subjected to a drying treatment at various steps. For example, a semiconductor wafer is dried at a pretreatment step such as the diffusing step. Moreover, a semiconductor wafer having a photo-resist film formed thereon is dried prior to the patterning of the photo-resist film and also after the patterning thereof. It is intended by the drying prior to the patterning thereof and the drying after the patterning thereof that the photo-resist is not only dried but also baked and, therefore, such drying prior to the patterning and that after the patterning are called "pre-baking" and "post-baking", respectively. However, the conventional drying methods adopted at these steps involve various problems to be solved.

For example, for drying at a pretreatment step, such as the diffusing step, there is adopted a method in which semiconductor substrates are maintained at an elevated temperature of from 100° to 150° C. for 10 to about 15 minutes in nitrogen ($N_2$). In this method, the drying time is long and, therefore, the method involves problems of reduction of clarity in the semiconductor substrates. Furthermore, for drying semiconductor substrates before coating thereof with a photoresist in a photo-process, especially semiconductor substrates having an insulating glass layer of a high moisture-absorbing property attached to the surface thereof, in order to improve the adhesion between the semiconductor substrate and the photo-resist film, it is necessary to carry out a heat treatment in nitrogen at about 200° C. for about 30 minutes by using an electric furnace or the like. Moreover, in the conventional drying method using a heating furnace, which is adopted for performing the drying treatment of semiconductor substrates having a photo-resist film attached thereto in the photo-process, since the photo-resist film is dried from the surface thereof, in order to remove a solvent contained in the photo-resist film completely, it is necessary to use an electric furnace and maintain the semiconductor substrate in nitrogen at about 150° C. for about 15 or 20 minutes. Therefore, during this drying treatment, the surface of the photo-resist film deteriorates, and various disadvantages arise. For example, the photo-resist film becomes unsuitable for formation of a delicate and fine pattern thereon and peeling of the photo-resist film becomes difficult.

Japanese Laid-open Patent Application No. S50-69,972/1975 discloses an apparatus for heating a semiconductor wafer by microwave heating wherein the wafer is irradiated with microwaves in such a state that the predominant faces thereof are parallel to the opening face of a waveguide provided therein. This apparatus is provided with means for rocking the wafer so that the wafer is heated uniformly. However, the apparatus provided with such rocking means is complicated and the production of the semiconductor element is not efficient.

SUMMARY OF THE INVENTION

It is, therefore, a primary object of the present invention to provide a method for drying semiconductor substrates in which semiconductor substrates differing in the surface conditions can easily be dried in a relatively short period of time without contamination or deterioration thereof.

Another object of the present invention is to provide a method for drying semiconductor substrates in which a plurality of semiconductor substrates can be simultaneously and uniformly dried.

Other objects and advantages of the present invention will be apparent from the following description.

In accordance with the present invention, there is provided a method for drying semiconductor substrates, which comprises irradiating a plurality of semiconductor substrates with electromagnetic waves emitted from a waveguide in a non-reactive atmosphere of normal atmospheric pressure while holding the semiconductor substrates so that the predominant faces thereof substantially form a right angle to the face of an opening in the waveguide.

BRIEF DESCRIPTION OF THE DRAWINGS

The present invention will now be described in detail with reference to the accompanying drawings, in which.

DESCRIPTION OF THE PREFERRED EMBODIMENTS

Figure 1:
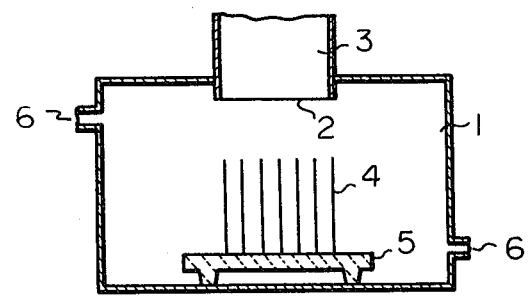
FIG. 1 is a sectional diagram showing an embodiment of the drying apparatus used for carrying out the method of the present invention.

Referring to FIG. 1, the drying apparatus used for carrying out the method of the present invention comprises a waveguide 3 arranged in the upper portion of a drying chamber 1. This waveguide 3 has an opening face 2 parallel to the floor face of the drying chamber 1.

By the term "opening face" used herein is meant a virtual face defining the end of an opening of the waveguide 3, which virtual face is perpendicular to the longitudinal axis of the waveguide 3. A substrate holder 5 is disposed in the drying chamber 1 below the opening face 2 of the waveguide 3 to hold a plurality of semiconductor substrates 4 so that the predominant faces of the semiconductor substrates 4 substantially form a right angle to the opening face 2 of the waveguide 3. In FIG. 1, reference numeral 6 represents gas introduction and discharge pipes. In the method of the present invention wherein the drying apparatus having the above-mentioned structure is used, electromagnetic waves having a frequency of, for example, 2.45 GHz, which are transmitted through the waveguide 3, are emitted from the opening of the waveguide 3 into the atmosphere of a non-reactive gas, such as nitrogen, in the drying chamber 1, and a plurality of semiconductor substrates 4 held at right angles to the opening face 2 of the waveguide 3 are irradiated with electromagnetic waves, whereby the temperature of the semiconductor substrates 4 is promptly elevated by induction heating to effect drying of the semiconductor substrates.

The semiconductor substrates 4 may be placed on the substrate holder 5 at intervals of from about 5 mm to about 20 mm. The distance between the opening face of the wave guide 3 and the semiconductor substrates 4 is usually varied in the range of from about 3 to about 10 cm.

It is normal for electromagnetic waves having a frequency of about 1 to about 5 GHz to be emitted at an output of about 10 W to about 2 KW. More specifically, when a semiconductor wafer is dried at a pretreatment step, it is normal for electromagnetic waves having a frequency of about 1 to 3 GHz at an output of about 500 W to about 2 KW to be emitted. When a semiconductor wafer having a photo-resist film formed thereon is heated in the photo-etching process, it is normal for electromagnetic waves having a frequency of about 2 to 5 GHz at an output of about 10 to 300 W to be emitted. The period of irradiation may suitably be varied depending upon, for example, the energy of the electromagnetic waves used. Namely, when the wafer is dried at a pretreatment step, the wafer may preferably be irradiated at an output of about 500 W for 2 to 5 minutes. When the wafer having a photo-resist is heated in the photo-etching process, the wafer may preferably be irradiated at an output of 240 W for 20 to 40 seconds.

The non-reactive gas used includes, for example, inert gases such as nitrogen, argon and helium. Other gases can be used, unless these gases are substantially reactive to the semiconductor wafer. For example, when the wafer is dried at a pretreatment step, the drying can be carried out in a dry air atmosphere. When a semiconductor substrate having an oxide layer on the surface thereof is dried, the drying can be effected in an oxygen-containing atmosphere.

Figure 2:
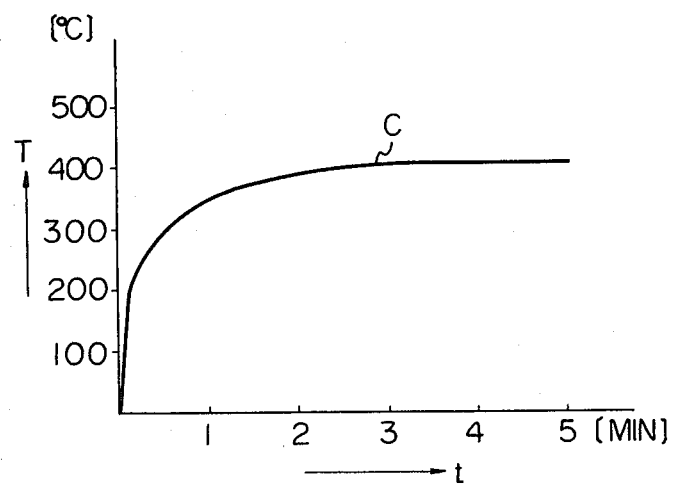
FIG. 2 is a diagram illustrating the relation between the electromagnetic wave emission time (t, min.) and the semiconductor substrate temperature (T, °C.) in one embodiment of the present invention.

FIG. 2 is a diagram illustrating the relation between the electromagnetic wave emission time (t in min.) and the semiconductor substrate temperature (T in °C.), which is obtained when, for example, electromagnetic waves having a frequency of 2.45 GHz are emitted at an output of 240 W on semiconductor substrates having a diameter of 4 inches according to the method of the present invention. As is seen from the temperature-time curve C of FIG. 2, the semiconductor substrate temperature can be elevated to about 400° C. in a very short time, for example, about 2 minutes, according to the method of the present invention.

Embodiments where semiconductor substrates are dried at various steps according to the present invention will now be specifically described. More specifically, electromagnetic waves are emitted at the above-mentioned output from a waveguide having a square opening of about 10 cm × about 10 cm, and about 15 semiconductor substrates having a diameter of about 4 inches are vertically arranged at intervals of about 5 mm at right angles to the opening face of the waveguide beneath the opening of the guidewave. Drying conditions were adopted at various steps and the achieved advantages are described below.

(i) In the drying treatment of the semiconductor substrates after being washed with water in a preliminary treatment step, such as the diffusing step, the semiconductor substrates were sufficiently dried within one minute, and therefore, the surface clarity of the semiconductor substrates was not damaged.

(ii) In the drying of semiconductor substrates having an insulating glass layer of a high moisture-absorbing property, or a similar layer formed thereon, before coating of a photo-resist in the photo-etching process, the semiconductor substrates were sufficiently dried within a time as short as 1 to 3 minutes, and it was certain that a good adhesion of the photo-resist film to the semiconductor substrate could be attained.

(iii) At the drying of semiconductor substrates having a photo-resist film formed thereon in the photo-resist process, since drying of the photo-resist film according to the method of the present invention is accomplished by temperature elevation owing to induction heating in the semiconductor substrate, the photo-resist film is dried from the bottom face contiguous to the semiconductor substrate toward the outer surface. Therefore, the photo-resist film is completely dried in a very short time, from about 20 to 30 seconds, and deterioration of the surface of the photo-resist film or seizing of the photo-resist film to the semiconductor substrate does not occur at all.

In the foregoing description, the drying time is the time required for drying the semiconductor substrate. However, when the substrate holder is made of an insulating material, such as quartz, and drying is carried out in the state where water drops adhere to the substrate holder, since the induction heating efficiency of the substrate holder is very low, there is caused a disadvantage in which the drying of the substrate holder takes longer than the drying of the semiconductor substrate. Therefore, in order to eliminate this disadvantage, it is preferable to form a film of a material having a high induction heating efficiency, such as silicon, on the substrate holder by vacuum deposition or to remove water drops adhering to the substrate holder as much as possible by centrifugal separation or the like. When the photo-resist film is dried, if the series of the semiconductor substrates to be treated are sandwiched by a pair of dummy substrates placed in both side ends thereof, the drying conditions can be made more uniform throughout.

The invention will be further illustrated by the following example.

EXAMPLE

In this example, it is substantiated that the methods of the present invention are advantageous in that a more uniform and narrower temperature distribution can be achieved in the drying step as compared with a conventional drying method wherein a semiconductor substrate is dried by irradiating the substrate with electromagnetic waves emitted from a waveguide while holding the substrate substantially parallel to the opening face of the waveguide.

PREPARATION OF SPECIMEN

A semiconductor substrate wafer having a diameter of four inches was coated with a phosphosilicate glass of a thickness of 0.5 microns and, then, a negative type photo-resist was coated thereon by spin-coating at 5,000 rpm to form a photo-resist film having a thickness of 0.5 microns. Thereafter, the photo-resist film was exposed to light and then etched by an etchant comprised of an aqueous hydrofluoric acid solution ($H_2O:HF = 20:1$) to form a stripe pattern having a distance of 3 microns between the stripes.

CONVENTIONAL DRYING METHOD

The wafer specimen having the stripe pattern was placed in a 240 watt microwave oven so that the predominant faces of the specimen were parallel to the opening face of the waveguide provided in the oven, where the specimen was irradiated with electromagnetic waves having a frequency of 2.45 GHz for 10 seconds while nitrogen was introduced into the oven. After the specimen was cooled to room temperature, the distance between the adjacent lines of phosphosilicate glass was measured at nine points, which are marked with 1, 2, 3, 4, 5, I, II, IV and V on a predominant face of the specimen in FIG. 3A. The measured results are shown in FIG. 3B wherein the ordinate expresses the distance between the adjacent lines of phosphosilicate glass in microns and the abscissa expresses the nine locations where the distance between lines was measured.

Figure 3A:
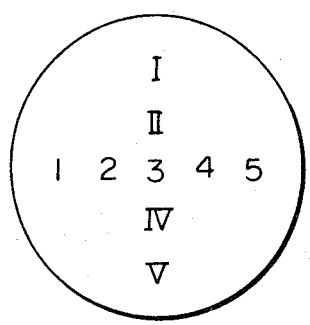
FIG. 3A illustrates the location of several points lying on a wafer specimen, on which points the temperature was determined.
Figure 3B:
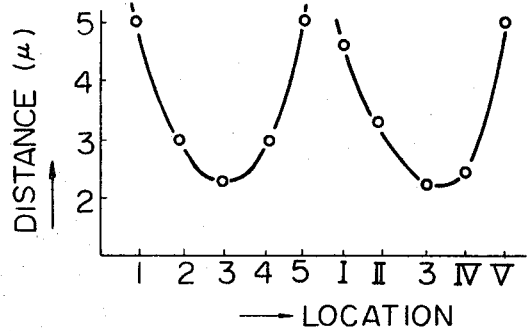
FIG. 3B is a graph showing the temperature distribution on a wafer specimen as determined when dried by a conventional method.

The graph in FIG. 3B shows that the center of the specimen marked with "3" in FIG. 3A, was on the highest energy level, and thus, the photo-resist was melted and the distance between the adjacent lines became narrowest. In contrast, the peripheral portion of the specimen marked with "1", "5", "I" and "V" in FIG. 3A, was on the lowest energy level, and thus, the adhesion between the photo-resist and the phosphosilicate glass became poor and the distance between the adjacent lines became widest.

DRYING METHOD OF PRESENT INVENTION

Figure 3C:
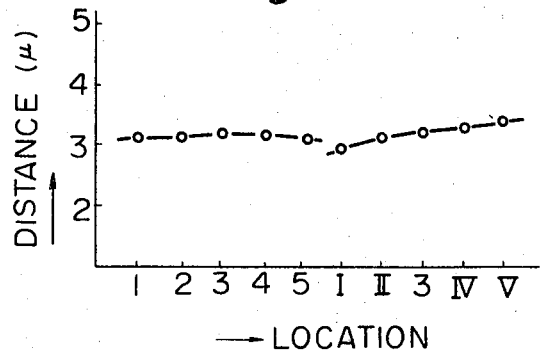
FIG. 3C is a graph showing the temperature distribution on a wafer specimen as determined when dried by the method of the present invention.
Figure 3D:
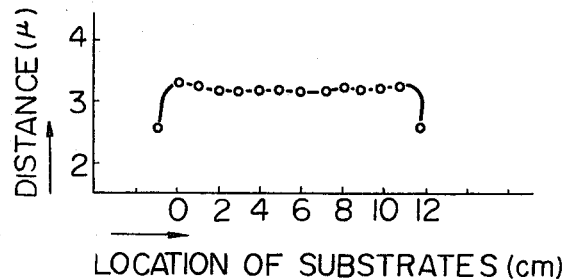
FIG. 3D is a graph showing the temperature distribution between wafer specimens as determined when dried by the method of the present invention.

Twelve wafer specimens were placed in the same 240 watt microwave oven as mentioned above so that the predominant faces of the specimens formed right angles to the face of an opening of the waveguide as illustrated in FIG. 1. One dummy substrate specimen was placed at each end of the twelve specimens, so that the two dummy specimens sandwiched the twelve specimens. The distance between the adjacent specimens was 1 cm. The specimens were heated for 30 seconds and irradiated with electromagnetic waves having a frequency of 2.45 GHz in a nitrogen atmosphere. After the specimens were cooled to room temperature, the distance between the adjacent lines of phosphosilicate glass was measured at the same nine points on each specimen as shown in FIG. 3A. The results are shown in FIG. 3C wherein the ordinate expresses the distance of the adjacent lines and the abscissa expresses the nine locations. The graph in FIG. 3C shows that each specimen was on a relatively low energy level due to the mutual filtering effect of the specimen, but the distance between the adjacent lines of phosphosilicate glass was substantially uniform over the entire predominant surface of each specimen. The results are also shown in FIG. 3D wherein the ordinate expresses the distance between the adjacent lines of phosphosilicate glass as measured at the central point "3" (FIG. 3A) in each specimen, and the abscissa expresses the location of the respective specimens, i.e., the distance (in centimeters) thereof from the specimen located at the utmost end position. The graph in FIG. 3D shows that the distance between the adjacent lines of phosphosilicate glass was substantially uniform over all the specimens, except for the two dummy specimens.

As will be apparent from the foregoing description, according to the method of the present invention, semiconductor substrates differing in surface condition can be dried in a relatively short time, and therefore, contamination of the semiconductor substrates, deterioration of photo-resist films or seizing of photo-resist films to the semiconductor substrates can be prevented completely. Furthermore, since a plurality of semiconductor substrates can simultaneously be treated, such effects as reduction of the manufacturing cost and improvement of the yield can be attained in the manufacture of semiconductor devices. Moreover, uniform heating can be achieved over the entire predominant surfaces of each wafer specimen and also over all of the wafer specimens.

We claim:

1. A method for drying semiconductor substrates, which comprises irradiating a plurality of semiconductor substrates with electromagnetic waves emitted from a waveguide in a non-reactive atmosphere of normal atmospheric pressure while holding the semiconductor substrates so that the predominant faces thereof substantially form right angles to the face of an opening of the waveguide, wherein the semiconductor substrates are positioned in a row on a substrate holder and a pair of dummy substrates are placed on the ends of said row, and wherein the substrates are placed at intervals of from about 5 mm to about 20 mm.

2. A method according to claim 1, wherein the distance between the semiconductor substrates and the opening face of the waveguide is from about 3 to 10 cm.

3. A method according to claim 1 or 2, wherein electromagnetic waves having a frequency of from about 1 to about 5 GHz are emitted at an output of from 10 W to about 2 KW.

4. A method for drying semiconductor substrates which comprises simultaneously irradiating for a short period of time a plurality of semiconductor substrates with electromagnetic waves emitted from a waveguide in a non-reactive atmosphere of normal atmospheric pressure while holding the semiconductor substrates so that the predominant faces thereof substantially form right angles to the face of an opening of the waveguide, wherein the semiconductor substrates are positioned on a substrate holder in a row at substantially right angles to the face of the waveguide opening and having a substantially uniform distance therebetween of from about 5 mm to about 20 mm, wherein a pair of dummy substrates is placed on the ends of said row for providing more uniform irradiation throughout, and wherein the distance between the semiconductor substrates and the opening face of the waveguide is from about 3 to 10 mm.

5. A method according to claim 4, wherein electromagnetic waves having a frequency of from about 1 to about 5 GHz are emitted at an output of from 10 W to about 2 KW.

6. A method according to claim 5, wherein the irradiation time period is appropriately varied dependent upon the energy of the electromagnetic waves.

7. A method according to claim 1 or 4, wherein the substrate holder is made of an insulating material.

8. A method according to claim 1 or 4, wherein the substrate holder has a film of material having a high induction heating efficiency, formed thereon.

9. A method according to claim 7, wherein the substrate holder has a film of material having a high induction heating efficiency, formed thereon.

10. A method according to claim 8, wherein the film is made of silicon.

11. A method according to claim 9, wherein the film is made of silicon.

* * * * *

UNITED STATES PATENT AND TRADEMARK OFFICE
CERTIFICATE OF CORRECTION

PATENT NO. : 4,412,388

DATED : Nov. 1, 1983

INVENTOR(S) : Takagi et al.

It is certified that error appears in the above-identified patent and that said Letters Patent is hereby corrected as shown below:

Column 1, line 29, delete "about".

Signed and Sealed this

Tenth Day of July 1984

[SEAL]

Attest:

GERALD J. MOSSINGHOFF

Attesting Officer

Commissioner of Patents and Trademarks